United States Patent [19]

Ohi

[11] Patent Number: 4,874,945

[45] Date of Patent: Oct. 17, 1989

[54] ELECTRON MICROSCOPE EQUIPPED WITH SCANNING TUNNELING MICROSCOPE

[75] Inventor: Kimio Ohi, Tokyo, Japan

[73] Assignee: Jeol Ltd., Tokyo, Japan

[21] Appl. No.: 260,525

[22] Filed: Oct. 21, 1988

[30] Foreign Application Priority Data

Oct. 23, 1987 [JP] Japan .................................. 62-267880

[51] Int. Cl.[4] .............................................. H01J 37/00
[52] U.S. Cl. ................................ 250/306; 250/423 F; 250/311
[58] Field of Search ..................... 250/306, 423 F, 311

[56] References Cited

U.S. PATENT DOCUMENTS 4,798,989 1/1989 Miyazaki et al. .................... 250/311

Primary Examiner—Bruce C. Anderson

Attorney, Agent, or Firm—Fitzpatrick Cella Harper & Scinto

[57] ABSTRACT

An electron microscope equipped with a scanning tunneling microscope. The electron microscope comprises a holder, a scanning tunneling microscope scanner having a tip, and a shift mechanism. A sample is fixed inside the holder that is mounted between the upper pole piece and the lower pole piece of an objective lens. The shift mechanism moves the scanner in two directions parallel to the surface of the sample and in a direction vertical to the sample surface. The tip is poised above a desired portion of the sample by driving the shift mechanism while observing the tip and either a reflection electron microscope image or a transmission electron microscope image of the sample. Then, the scanner uses the tip to scan the sample surface to obtain a scanning tunneling microscope image.

4 Claims, 3 Drawing Sheets

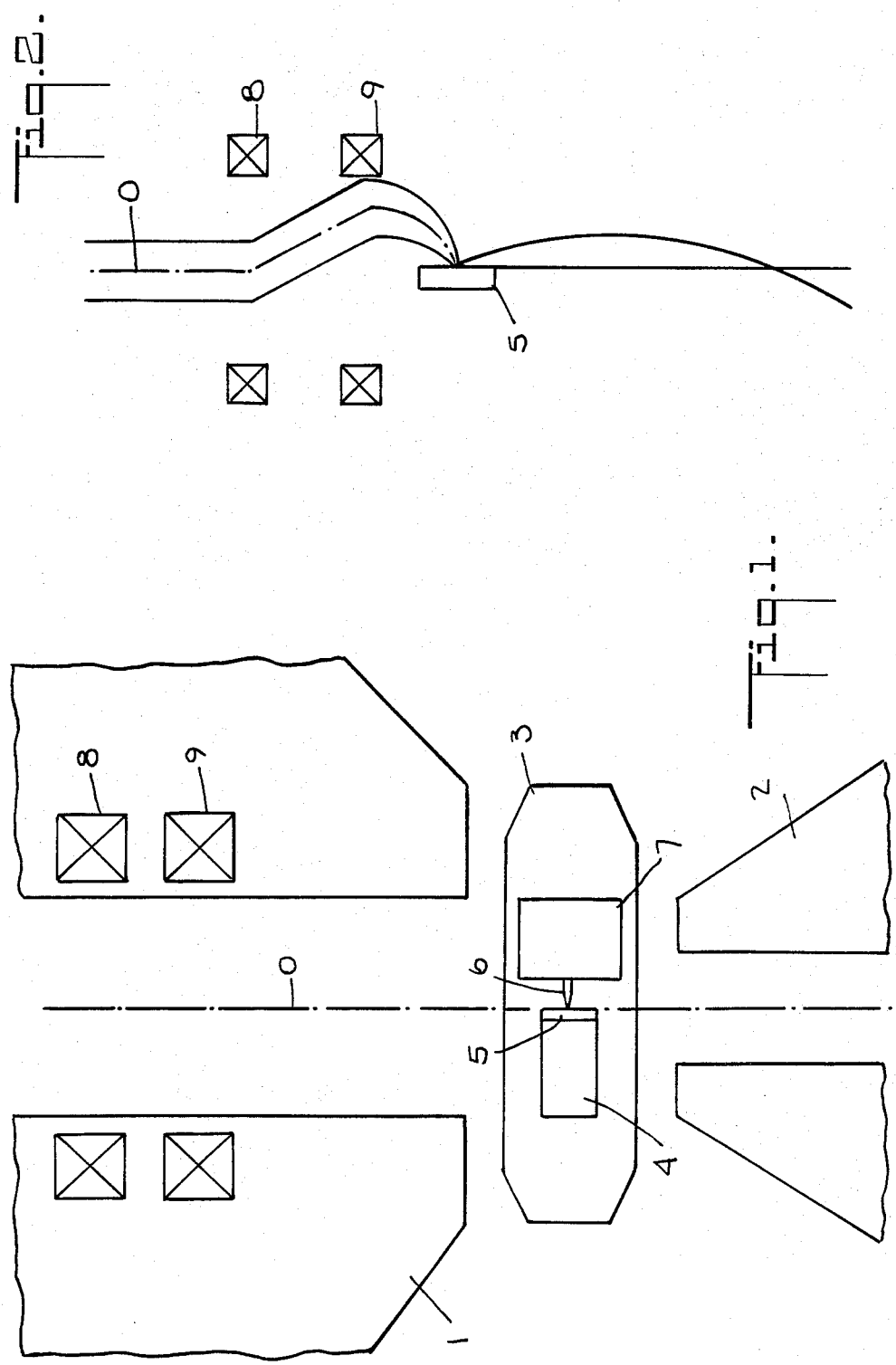

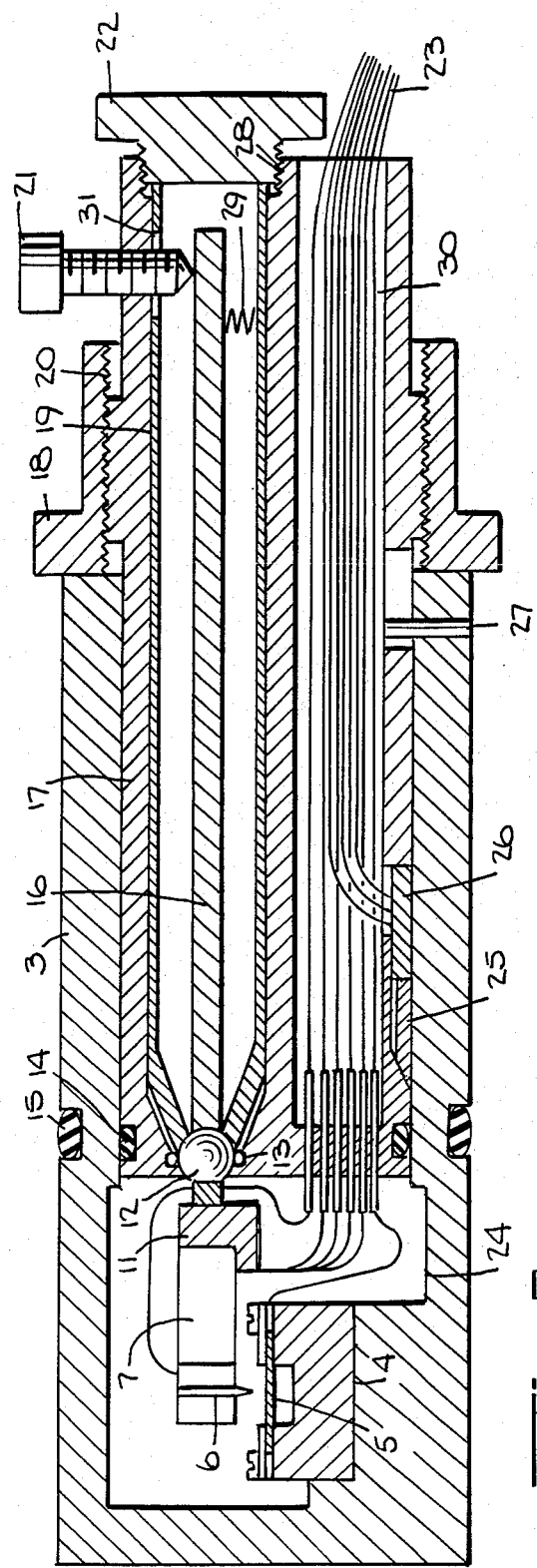
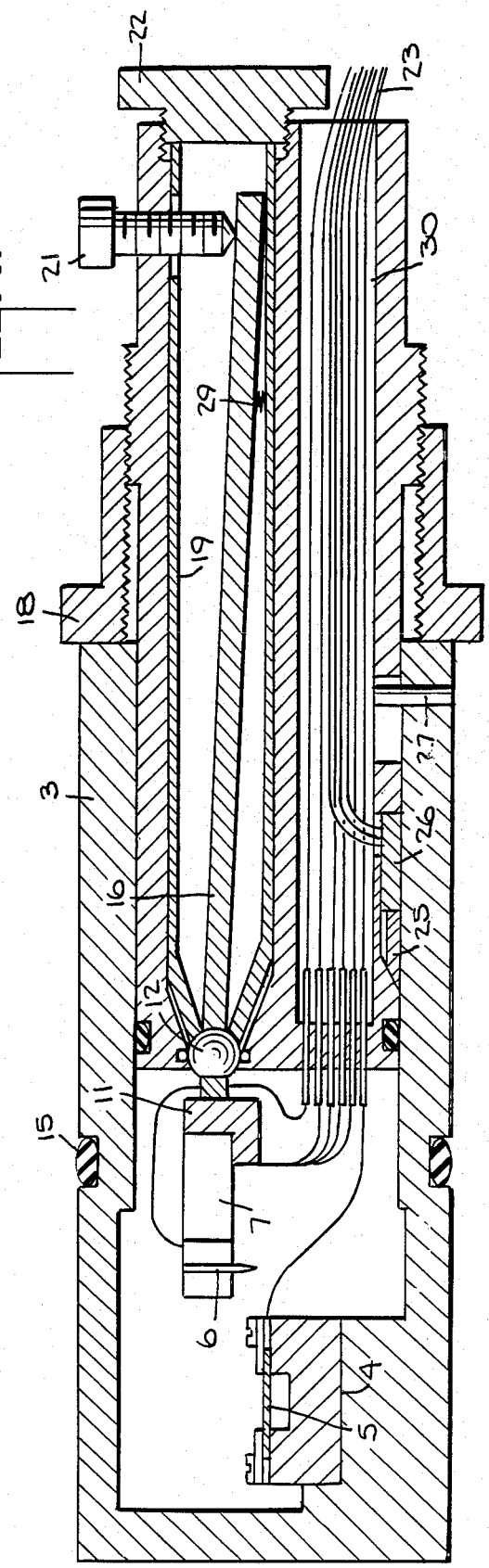
Fig. 3.
Fig. 4.

ELECTRON MICROSCOPE EQUIPPED WITH SCANNING TUNNELING MICROSCOPE

FIELD OF THE INVENTION

The present invention relates to an electron microscope equipped with a scanning tunneling microscope whose field of view is located by means of an electron microscope image.

BACKGROUND OF THE INVENTION

In scanning tunneling microscopy, a probe tip is brought close to a sample so that a space of approximately a few nanometers (nm) may be left between them, in order that an electron cloud on the tip and an electron cloud on the sample surface may be superimposed. Under this condition, a voltage is applied between the tip and the sample. The resulting current is called a tunneling current. When the applied voltage is several millivolts (mv) to several volts (V), the tunneling current is approximately 1 to 10 nanoamperes (nA). The magnitude of the tunneling current is proportional to the distance between the sample and the tip. Thus, this distance can be determined quite accurately by measuring the magnitude of the tunneling current. The tip is scanned across the sample surface at a constant height above a reference plane in the sample. The produced tunneling current is measured to determine the topography of the sample surface. If the position of the tip is so controlled that the tunneling current is kept constant, then the topography of the sample surface can be similarly determined by tracing the position of the tip. The principle of the scanning tunneling microscope is explained in U.S. Pat. No. 4,343,993.

The scanning tunneling microscope has very high resolution, but its field of view is quite narrow. Therefore, it is impossible to know from an image obtained by the scanning tunneling microscope what portion of the sample is being observed. In other words, it is important to decide what portion of the sample should be observed with the scanning tunneling microscope to make a topographical analysis of the sample. Using a scanning electron microscope as a means for determining the field of view of a scanning tunneling microscope has been reported. One example of a scanning electron microscope incorporating a scanning tunneling microscope is described in an article entitled "Scanning Tunneling Microscope Combined With a Scanning Electron Microscope" by Ch. Gerber, G. Binning, H. Fuchs, O. Marti, and H. Rohrer in Rev. Sci. Instrum. 57(2), February 1986, pp. 221-224.

Greatly uneven sample surfaces can be observed very well by scanning electron microscopy. However, it is difficult using scanning electron microscopy to make a topographical analysis of a sample surface that is only slightly uneven, because its protruding portions and recessed portions emit secondary electrons at close rates. Consequently, scanning electron microscopy is not very suitable for locating a flat surface that is necessary for the scanning tunneling microscope.

It is therefore desirable to use a transmission electron microscope having higher resolution than a scanning electron microscope to determine the field of view of a scanning tunneling microscope. Because the transmission electron microscope has higher resolution than the scanning electron microscope, and therefore a small gap between the objective lens pole pieces, the smallness of the gap must be taken into account in mounting a scanning tunneling microscope into a transmission electron microscope. Also, the scanner of the scanning tunneling microscope must be so mounted in the gap that it is insusceptible to vibration.

SUMMARY OF THE INVENTION

It is an object of the invention to provide a transmission electron microscope which is equipped with a scanning tunneling microscope and permits one to determine the field of view of the scanning tunneling microscope.

It is another object of the invention to provide a transmission electron microscope which is equipped with a scanning tunneling microscope having a scanner that is insusceptible to vibration.

An electron microscope which is equipped with a scanning tunneling microscope in accordance with the invention comprises a holder disposed between the upper pole piece and the lower pole piece of an objective lens, a scanning tunneling microscope scanner having a tip that is mounted inside the holder, and a shift mechanism for moving the scanner inside the holder in two directions parallel to the surface of a sample fixed inside the holder, for example in the X and Y directions, as well as in a direction perpendicular to the sample surface.

BRIEF DESCRIPTION OF THE DRAWINGS

FIG. 1 is a schematic representation of an instrument in which a transmission electron microscope is combined with a scanning tunneling microscope in accordance with the present invention and produces a reflection image, and in which the field of view of the scanning tunneling microscope is determined from the reflection image;

FIG. 2 is a diagram showing the orbit of the electron beam in the apparatus shown in FIG. 1;

FIG. 3 is a side elevation of one example of the sample holder 3 shown in FIG. 1;

FIG. 4 is a view similar to FIG. 3, but in which the scanning tunneling microscope scanner is at a distance from the surface of a sample;

DESCRIPTION OF THE PREFERRED EMBODIMENTS

Figure 5:
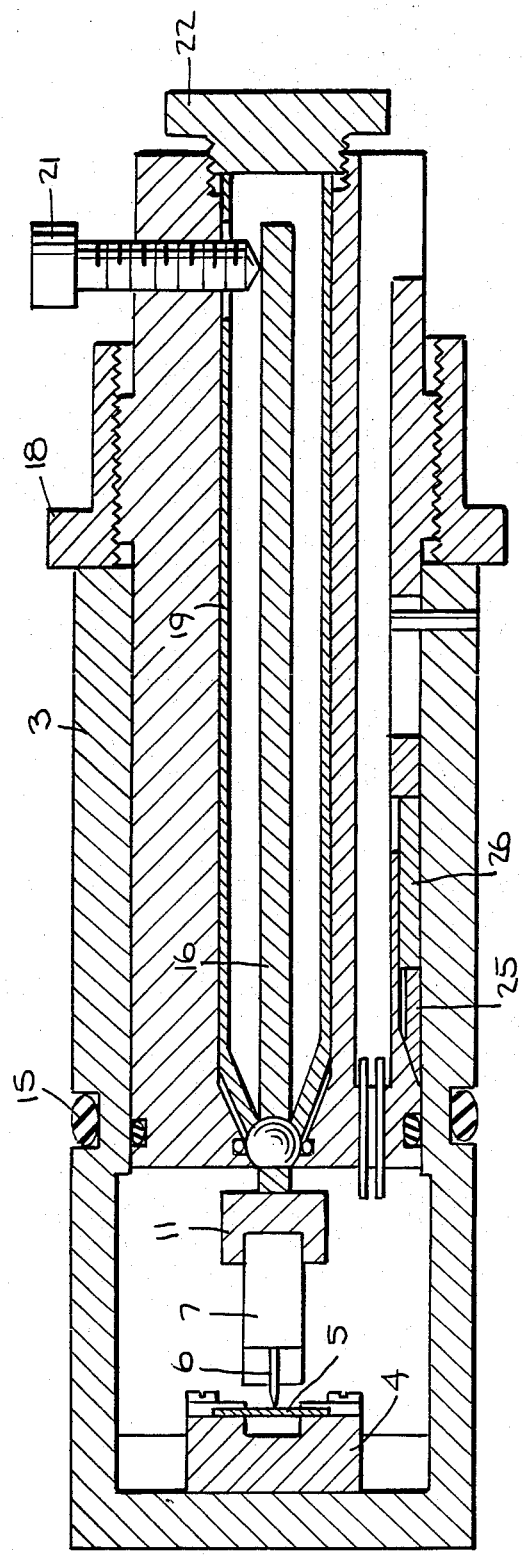
FIG. 5 is a side elevation of another instrument according to the invention, and in which a scanning tunneling microscope scanner is perpendicular to the surface of a sample.

Referring to FIG. 1, an instrument in which a transmission electron microscope is combined with a scanning tunneling microscope in accordance with the invention is schematically shown. The transmission electron microscope produces a reflection image. The field of view of the scanning tunneling microscope is determined from the reflection image. The instrument includes an objective lens having an upper pole piece 1 and a lower pole piece 2. A sample holder 3 is disposed in the gap between the pole pieces 1 and 2. A sample mount 4 is fixed to the holder 3. A sample 5 is placed on the sample mount 4 in such a way that its surface lies along the optical axis 0. The scanning tunneling microscope includes a scanner 7 having a tip 6 that is opposed to the sample 5. The scanner 7 measures approximately 1.6 mm×3 mm×5 mm. This scanner can be a scanner disclosed in an article entitled "Single-tube Three-dimensional Scanner for Scanning Tunneling Microscopy" by G. Binnig and D. P. E. Smith, in Rev. Sci. Instrum. 57(8), August 1986, pp. 1688-1689. Two deflection coils 8 and 9 are disposed over the upper pole piece 1 of the objective lens.

In operation, the electron beam is converged by a magnetic field produced in front of the objective lens. As shown in FIG. 2, the beam is bent by the deflection coils 8 and 9 and falls upon the sample surface at a certain angle to form a spot upon the surface. The electron beam reflected from the surface of the sample 5 passes through the optical axis and forms a reflection electron image below the objective lens. This image is focused onto a fluorescent screen (not shown) to observe the sample surface. At this time, the sample surface is parallel to the optical axis and, therefore, the unevenness of the sample surface shades the electron beam. Thus, fringes corresponding to the topography of the sample surface are developed on the fluorescent screen. Appearing on the fluorescent screen are the reflection images of the sample surface and the shadow of the front end of the tip. Consequently, the front end of the tip 6 can be poised above a desired portion of the sample surface by moving the scanner 7 having the tip 6 relative to the sample 5 while observing the reflection image and the shadow of the front end of the tip. Thereafter, the tip 6 can be shifted within quite narrow ranges in the X, Y, and Z directions by the use of the scanner 7 to obtain a scanning tunneling micrograph of the selected microscopic region of the sample surface. The resolution of this tunneling micrograph is on an atomic scale. The permitted amplitude of vibration of the tip 6 relative to the sample surface is less than 0.1°. In this example, the sample 5 and the tip 6 are fixed within the same holder and so vibration of the tip can be suppressed below an acceptable level.

A specific example of the sample holder is shown in FIG. 3, where the sample mount 4 is fixed within the sample holder 3. An inner tube 17 is mounted inside the holder 3 so as to be slidable axially of the holder. The tube 17 is in contact with the inner surface of the holder 3. The sample 5 is fixed to the sample mount 4 such that the surface of the sample extends along the central axis of the holder 3. The tip 6 is attached to the front end of the tip scanner 7 opposite to the surface of the sample 5. The scanner 7 is rigidly fixed to an arm 11. The tube 17 has a tapering portion at its front end. The tapering portion is provided with a groove 13 in which an O ring used as an airtight seal is fitted. A ball 12 that is integral with the arm 11 is rotatably held and maintained airtight. A bar 16 is mounted integral with the ball 12 and has a free front end. The bar 16 is pushed upward by a spring 29 and pushed downward by a screw 21. Therefore, the arm 11 can be caused to pivot on the ball 12 by rotating the screw 21 and causing the free end of the bar 16 to shift upward or downward. In this way, the tip 6 can be moved toward or away from the sample 5. That is, the scanner 7 can be moved in a direction perpendicular to the sample, or Z direction. A second screw (not shown), similar to the screw 21, is mounted vertical to the plane of the drawing. The tip 6 can be moved along the sample surface and in a direction perpendicular to the plane of the figure, or X direction, by operating the second screw.

The arm 11, the ball 12, and the bar 16 are disposed off the central axis of the holder 3. A space 30 is formed below these members. Lead wires 23 are received in the space 30. A groove 14 is formed between the inner tube 17 and the holder 3. An O ring is fitted in the groove 14 to provide an airtight seal. This O ring cooperates with the O ring fitted in the groove 13 to maintain the surroundings of the sample as a vacuum. Also, a hermetic seal 24 is formed for the lead wires 23 which are used to drive the scanner. The inner tube 17 has a screw 20 that is in mesh with the screw of a dial 18. When the dial 18 is rotated, the inner tube 17 moves axially, because a pin 27 prevents it from turning. In this way, the field of view can be found axially, or in the Y direction, of the holder 3. A lock member 19 having a tapering front end portion extending to the ball 12 is mounted inside the inner tube 17. The lock member 19 is provided with a hole 31 through which the screw 21 extends. A screw 28 is formed at the rear end of the inner tube 17, and a knob 22 is mounted to the screw 28. The knob 22 is in contact with the rear end of the lock member 19. As the knob 22 is rotated, the tapering front end portion of the lock member is pressed against the ball 12 to make the ball 12 stationary. Under this condition, the arm 11 is not easily moved, and the rigidity is increased.

The surface of the inner tube 17 which is in contact with the holder 3 is provided with a tapering groove in which a wedge 25 and a laminate piezoelectric device 26 that pushes the wedge 25 are disposed. When the piezoelectric device 26 is driven and stretched, the wedge 25 is forced between the inner tube 17 and the holder 3 to thereby lock the inner tube 17. Thus, the rigidity is increased.

In operation of this structure, the holder 3 is inserted into a side-entry goniometer (not shown). The holder 3 is then moved to shift the sample, for finding the field of view. Thus, a reflection electron microscope image is obtained. A region of interest for a scanning tunneling microscope image is set while observing the reflection electron microscope image. The tip 6 is brought close to the region of interest. Specifically, the screw 21 is rotated to move the tip 6 perpendicularly to the surface of the sample 5, or in the Z direction. The dial 18 is rotated to shift the tip axially in the holder 3, or in the Y direction. The aforementioned second screw (not shown) is rotated to move the tip perpendicularly to the plane of the drawing, or in the X direction. The tip 6 is brought close to the sample 5 by operating the screw 21 while observing the gap between the sample 5 and the tip 6 in the reflection electron microscope image, until tunneling current is detected. Consequently, the tip 6 is prevented from colloiding with the sample 5; otherwise the tip or the sample might be damaged.

After the tip 6 has been placed close to the desired portion of the scanning tunneling microscope image of the sample surface, the knob 22 is rotated to push the lock member 19, and thereby fix the ball 22 and the arm 11. The piezoelectric device 26 is driven to make the inner tube 17 stationary. As a result, the rigidity of the whole structure inside the holder increases. Hence, good freedom from vibration is achieved in scanning the tip 6 by the scanner 7.

When the sample is baked or undergoes an evaporation operation inside the holder 3, the screw 21 is rotated to move the tip 6 away from the sample 5 to prevent the tip 6 from contacting the sample surface.

Under this condition, the dial 18 is rotated to pull the inner tube 17 outwardly from the holder 3. This state is shown in FIG. 4. Then, the baking of the sample 5 or the evaporation operation is performed. Since the tip 6 is distant form the sample surface, metal or vapor does not adhere to the tip 6. Also, other adverse effects can be prevented.

FIG. 5 shows another instrument which is similar to the instrument shown in FIG. 3 except that the sample 5 is disposed perpendicular to the axis of the holder 3.

Figure 6:
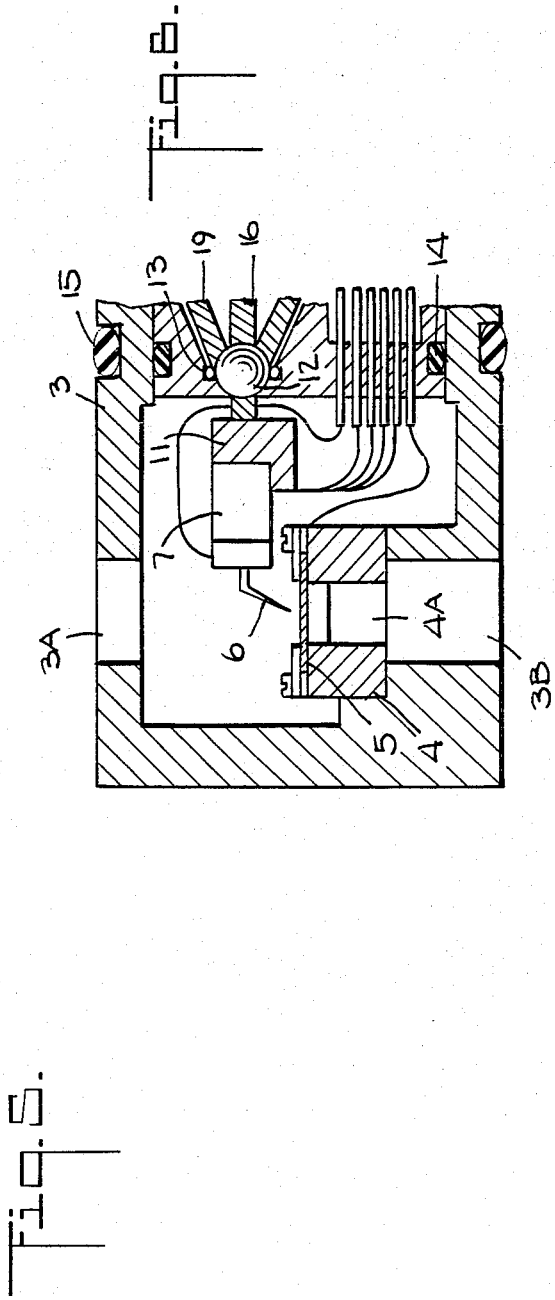
FIG. 6 is a side elevation of a further instrument in which a transmission electron microscope is combined with a scanning tunneling microscope in accordance with the invention and produces a transmission image, and in which the field of view of the scanning tunneling microscope is determined from the transmission image.

FIG. 6 shows the front end of a holder 3 that is used to observe a transmission electron microscope image to find the field of view of the scanning tunneling microscope. The holder 3 is provided with openings 3A and 3B to pass the electron beam. The sample mount 4 is also formed with an opening 4A to pass the electron beam.

The terms "scanning tunneling microscope", "electron microscope", "tunneling current tip", "scanning electron microscope", "transmission electron microscope", "scanner", "transmission image", "reflection image", "pole piece", "objective lens", "optical axis", "magnetic field", "deflection coils", "lock member", "knob", "piezoelectric device", "goniometer", "fluorescent screen", "micrograph", "inner tube", "O ring", "lead wire", "hermetic seal", and other terms identifying features of the disclosed invention are each used generically; that is, the functional requirements that must be met by each of the elements identified by these terms will be apparent to one of ordinary skill in the art, and those terms accordingly are used throughout the specification and the claims to designate any element known to those skilled in the art which meets such requirements.

The present invention is not limited to the details of the foregoing embodiments but includes various modifications within the scope and spirit of the appended claims.

What is claimed is:

1. An apparatus for observing a surface of a sample, said apparatus comprising:
   a transmission electron microscope comprising an objective lens, said lens comprising an upper pole piece and a lower pole piece;
   a holder disposed between the upper pole piece and the lower pole piece, and the sample being secured inside the holder;
   a scanning tunneling microscope comprising a scanner and a probe tip, the scanner being mounted inside the holder; and
   a shift mechanism arranged and constructed to move the scanner inside the holder in two directions parallel to the surface of the sample and in a direction perpendicular to the surface of the sample.

2. An apparatus according to claim 1, wherein the shift mechanism includes a securing mechanism arranged and constructed to secure the scanner with respect to the holder.

3. An apparatus according to claim 1, wherein the electron microscope is arranged and constructed to generate an electron beam along an optical axis and the sample is disposed parallel to the optical axis to provide a reflection image.

4. An apparatus according to claim 1, wherein the electron microscope is arranged and constructed to generate an electron beam along an optical axis and the sample is disposed perpendicular to the optical axis to provide a transmission image.

* * * * *